United States Patent
Graumann

(10) Patent No.: US 9,742,439 B1
(45) Date of Patent: Aug. 22, 2017

(54) METHOD AND DEVICE FOR FORWARD ERROR CORRECTION DECODER SYSTEM UTILIZING ORTHOGONALITY OF AN H MATRIX

(71) Applicant: Microsemi Solutions (U.S.), Inc., Aliso Viejo, CA (US)

(72) Inventor: Peter Graumann, Calgary (CA)

(73) Assignee: Microsemi Solutions (U.S.), Inc., Aliso Viejo, CA (US)

(*) Notice: Subject to any disclaimer, the term of this patent is extended or adjusted under 35 U.S.C. 154(b) by 0 days.

(21) Appl. No.: 14/733,288

(22) Filed: Jun. 8, 2015

(51) Int. Cl.
  *H03M 13/00* (2006.01)
  *H03M 13/05* (2006.01)
  *H03M 13/11* (2006.01)

(52) U.S. Cl.
  CPC ...... *H03M 13/1111* (2013.01); *H03M 13/116* (2013.01); *H03M 13/616* (2013.01)

(58) Field of Classification Search
  CPC ............ H03M 13/116; H03M 13/1111; H03M 13/114; H03M 13/1171; H03M 13/1174; H03M 13/1177; H03M 13/255; H03M 13/2906; H03M 13/2927; G06F 11/10; G06F 11/1012
  See application file for complete search history.

(56) References Cited

U.S. PATENT DOCUMENTS

| | | | |
|---|---|---|---|
| 8,990,661 B1* | 3/2015 | Micheloni ............ | H03M 13/112 714/758 |
| 2013/0031440 A1* | 1/2013 | Sharon ................ | G06F 11/1012 714/758 |
| 2014/0181612 A1 | 6/2014 | Gunnam et al. | |
| 2015/0149873 A1* | 5/2015 | Cai ..................... | H03M 13/458 714/773 |

* cited by examiner

*Primary Examiner* — Phung M Chung
(74) *Attorney, Agent, or Firm* — Dennis R. Haszko

(57) ABSTRACT

A method and apparatus for a quasi-cyclic low density parity check (QC-LDPC) decoder utilizes a parity check matrix (H matrix) having a matrix value for each row and column position in the matrix. Each matrix value is associated with an initial soft information element where, for each one of the matrix values associated with a constrained row, the one of the matrix values is constrained to a set of constraint values associated with a set of initial soft information elements. The set of initial soft information elements excludes a number of soft information elements that immediately precede a first initial soft information element. The first initial soft information element is associated with a selected first matrix value associated with a first row that immediately precedes the constrained row, and with the same column as the one of the matrix values in the constrained row.

17 Claims, 8 Drawing Sheets

100 →

|    | $D_1$ | $D_2$ | $D_3$ | ... | $D_{N-1}$ | $D_N$ | $P_1$ | $P_2$ | ... | $P_{M-1}$ | $P_M$ |
|----|-------|-------|-------|-----|-----------|-------|-------|-------|-----|-----------|-------|
| $R_1$ | 1 | 0 | 0 |  | 1 | 0 | 1 | 1 |  | 1 | 1 |
| $R_2$ | 0 | 1 | 0 |  | 1 | 1 | 0 | 0 |  | 1 | 0 |
| $R_3$ | 1 | 0 | 1 |  | 0 | 0 | 0 | 0 |  | 0 | 1 |
| ... |  |  |  |  |  |  |  |  |  |  |  |
| $R_{M-1}$ | 0 | 0 | 1 |  | 0 | 0 | 1 | 1 |  | 0 | 0 |
| $R_M$ | 0 | 1 | 0 |  | 1 | 0 | 0 | 1 |  | 0 | 1 |

|    | $C_{D1}$ | $C_{D2}$ | $C_{D3}$ | $C_{D4}$ | $C_{D5}$ | $C_{P1}$ | $C_{P2}$ | $C_{P3}$ | $C_{P4}$ | $C_{P5}$ | $C_{P6}$ |
|----|----------|----------|----------|----------|----------|----------|----------|----------|----------|----------|----------|
| $R_1$ | 7 | -1 | -1 | -1 | -1 | 11 | -1 | -1 | -1 | -1 | 1 |
| $R_2$ | -1 | 3 | -1 | -1 | -1 | -1 | 2 | -1 | -1 | 2 | -1 |
| $R_3$ | -1 | -1 | -1 | 0 | -1 | -1 | -1 | 15 | -1 | -1 | -1 |
| $R_4$ | -1 | -1 | 12 | -1 | 4 | -1 | -1 | -1 | 14 | -1 | -1 |
| $R_5$ | 10 | -1 | 2 | -1 | 5 | -1 | -1 | 11 | -1 | -1 | 0 |
| $R_6$ | -1 | 3 | -1 | 4 | -1 | 9 | 6 | -1 | 8 | 4 | -1 |

| 0 | 0 | 0 | 0 | 1 | 0 | 0 | 0 |
|---|---|---|---|---|---|---|---|
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |

FIG. 3

METHOD AND DEVICE FOR FORWARD ERROR CORRECTION DECODER SYSTEM UTILIZING ORTHOGONALITY OF AN H MATRIX

TECHNICAL FIELD

The present disclosure relates to low density parity check codes, for example quasi-cyclic LDPC (QC-LDPC) codes.

BACKGROUND

Low density parity code (LDPC) decoder systems are current generation iterative soft-input forward error correction (FEC) decoder systems that have found increasing popularity in FEC applications where low error floor and high error correction performance are desired. LDPC codes are defined in terms of a two-dimensional parity-check matrix, referred to as an H matrix, that represents a set of parity check equations such that cH=0 where c is a codeword of the LDPC code.

A sub-class of LDPC codes is quasi-cyclic LDPC (QC-LDPC) codes. In an H matrix of a QC-LDPC code, each matrix value represents a Q×Q circulant matrix, and a codeword comprises circulants of Q bits.

In a layered QC-LDPC decoder, soft information elements of each circulant stored in a memory is read and input to a layer processor, beginning from a starting soft information element determined by the H matrix and incremented sequentially until the entire content of the memory is input to the layer processor. The updated soft information elements output by the layer processor is written back to the memory over the original soft information.

Improvements to QC-LDPC decoders are desired.

DRAWINGS

The following figures set forth embodiments in which like reference numerals denote like parts. Embodiments are illustrated by way of example and not by way of limitation in the accompanying figures.

FIG. 1 is a LDPC matrix according to a known LDPC code;

FIG. 2 is a QC-LDPC matrix according to a known QC-LDPC code;

FIG. 3 is a 8×8 circulant matrix associated with a matrix value of the QC-LDPC matrix of FIG. 2;

DETAILED DESCRIPTION

Figure 4:
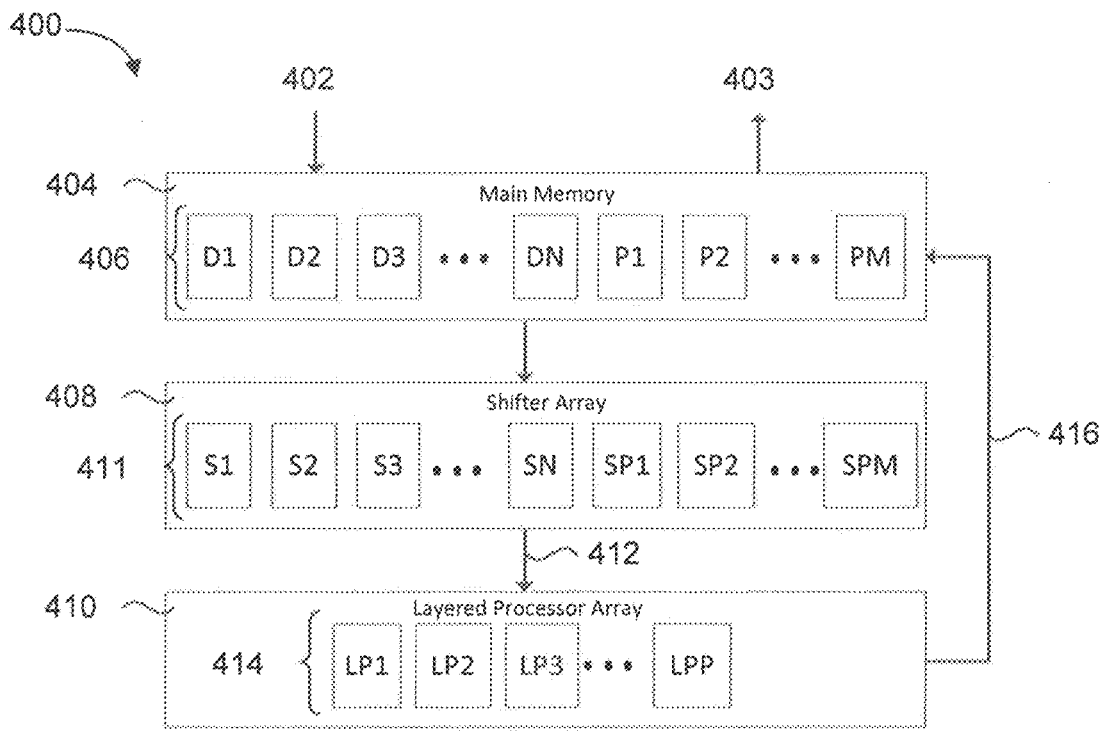
FIG. 4 is a block diagram illustrating a known architecture of a layered QC-LDPC decoder.

The following describes method for a quasi-cyclic low density parity check (QC-LDPC) decoder that reduces a stall period between processing sequential layers in a QC-LPDC decoder.

In an embodiment, the present disclosure provides a method of generating a parity-check matrix (H matrix) for providing a set of parity equations for use in a low density parity check (LDPC) decoder, the method comprising: generating a matrix framework having a plurality of rows and columns, each column associated with one of a plurality of circulants of a codeword; determining a matrix value for each row and column position in the generated matrix framework, each matrix value being associated with an initial soft information element, including, for each one of the matrix values associated with a constrained row: constraining the one of the matrix values to a set of constraint values associated with a set of initial soft information elements, the set of initial soft information elements excluding a number E*P of soft information elements that immediately precede a first initial soft information element, the first initial soft information element associated with a selected first matrix value associated with a first row that immediately precedes the constrained row and with the same column as the one of the matrix values in the constrained row, wherein E is an integer having a value less than or equal to the number of cycles of an inherent delay, D, of the QC-LDPC decoder and P is a parallelism factor of the QC-LDPC decoder; and populating the matrix framework with the plurality of matrix values.

In an example embodiment, the LDPC decoder comprises a layered quasi-cyclic LDPC (QC-LDPC) decoder, each row is associated with one layer of a QC-LDPC code, and all rows in the one layer comprise constrained rows.

In an example embodiment, each row of the H matrix is a constrained row.

In an example embodiment, a first value of E1 associated with a first constrained row is different than at least a second value of E2 associated with a second constrained row.

In an example embodiment, each circulant of the codeword has a size of Q bits, and each of the plurality of matrix values is associated with a Q×Q circulant matrix.

In an example embodiment, each circulant of the codeword has a size of Q bits, and each of the plurality of matrix values is associated with a Q×Q circulant matrix, and each one of the matrix values ($H_n$) of a constrained layer n, where n is a positive integer, satisfies: $H_n > (H_{n-1} - E_n * P + Q)$ modQ, wherein $H_{n-1}$ is the selected first matrix value associated with a first layer that immediately precedes the constrained layer and with the same column as the one of the matrix values $H_n$ in the constrained layer, and $E_n$ represents a pipeline stall reduction factor between layer n and layer n−1.

In an example embodiment, E is equal to D.

In another example, the present disclosure provides a method of decoding a codeword utilizing a quasi-cyclic low density parity check (QC-LDPC) decoder, the method comprising: obtaining a parity-check matrix (H matrix) having: a matrix framework having a plurality of rows and columns, each row associated with one layer of a QC-LDPC code, and each column associated with one of a plurality of circulants of a codeword; a matrix value for each row and column position in the matrix framework, each matrix value being associated with an initial soft information element, wherein: for each one of the matrix values associated with a constrained row: the one of the matrix values is constrained to a set of constraint values associated with a set of initial soft information elements, the set of initial soft information elements excluding a number E*P of soft information elements that immediately precede a first initial soft information element, the first initial soft information element associated with a selected first matrix value associated with a first row that immediately precedes the constrained row and with the same column as the one of the matrix values in the constrained row, wherein E is an integer having a value less than or equal to the number of cycles of an inherent delay, D, of the QC-LDPC decoder and P is a parallelism factor of the QC-LDPC decoder; storing the codeword in a main memory as soft information elements in a plurality of circulants; processing a first layer associated with the first row of the H matrix, processing the first layer comprising, for each of the plurality of circulants: sequentially reading the soft information elements of the circulant beginning at the initial soft information element associated with the matrix value of the first row associated with circulant until all of the soft information elements of the circulant are read; sequentially processing the soft information elements using a check-node processing element to generate updated soft information elements; and sequentially replacing the soft information elements stored in the main memory with the updated soft information elements; waiting (D-E) clock cycles after reading the first final soft information element; processing a second layer associated with the constrained row of the H matrix, processing the second layer comprising, for each of the plurality of circulants: sequentially reading the soft information elements of the circulant beginning at the initial soft information element associated with the matrix value of the constrained row associated with circulant until all of the soft information elements of the circulant are read; processing the soft information elements using a check-node processing element to generate updated soft information elements; and replacing the soft information elements stored in the main memory with the updated soft information elements.

In an example embodiment, storing the raw data comprises storing each circulant of the codeword in a separate memory element.

In an example embodiment, processing comprises removing extrinsic information from a previous iteration of the layer from the soft information to generate a subtractor output.

In an example embodiment, removing extrinsic information comprises removing extrinsic information generated and stored by the check-node processing element during a previous iteration of the layer In an example embodiment, processing comprises adding extrinsic information generated by the check-node processing element to the subtractor output to generate the updated soft information.

In an example embodiment, processing comprises using a belief propagation method.

In an example embodiment, the LDPC decoder comprises a layered quasi-cyclic LDPC (QC-LDPC) decoder, each row is associated with one layer of a QC-LDPC code, and all rows in the one layer comprise constrained rows.

In an example embodiment, each circulant of the codeword has a size of Q bits, and each of the plurality of matrix values is associated with a Q×Q circulant matrix, and each one of the matrix values ($H_n$) of a constrained layer n, where n is a positive integer, satisfies: $H_n > (H_{n-1} - E_n*P + Q) \mod Q$, wherein $H_{n-1}$ is the selected first matrix value associated with a first layer that immediately precedes the constrained layer and with the same column as the one of the matrix values $H_n$ in the constrained layer, and $E_n$ represents a pipeline stall reduction factor between layer n and layer n−1.

In another embodiment, the present disclosure provides a quasi-cyclic low density parity check (QC-LDPC) decoder having a parallelism factor of P and an inherent delay of D, the QC-LDPC decoder comprising: P layer processors, each of the layer processor configured to process a soft information element to generate an updated soft information element, and output the updated soft information elements; a main memory operably coupled to the P layer processors, the main memory for storing the codeword in a main memory as soft information elements in a plurality of circulants, the main memory including a controller configured to: obtain a parity-check matrix (H matrix) having: a matrix framework having a plurality of rows and columns, each row associated with one layer of a QC-LDPC code, and each column associated with one of a plurality of circulants of a codeword; a matrix value for each row and column position in the matrix framework, each matrix value being associated with an initial soft information element, wherein: for each one of the matrix values associated with a constrained row: the one of the matrix values is constrained to a set of constraint values associated with a set of initial soft information elements, the set of initial soft information elements excluding a number E*P of soft information elements that immediately precede a first initial soft information element, the first initial soft information element associated with a selected first matrix value associated with a first row that immediately precedes the constrained row and with the same column as the one of the matrix values in the constrained row, wherein E is an integer having a value less than or equal to the number of cycles of the inherent delay, D; for a first layer associated with the first row of the H matrix, and for each of the plurality of circulants: sequentially reading from the main memory the soft information elements of the circulant beginning at the initial soft information element associated with the matrix value of the first row associated with circulant until all of the soft information elements of the circulant are read; outputting the read soft information elements to the P layer processors; replacing the soft information elements stored in the main memory with the updated soft information elements output by the P layer processors; wait (D-E) clock cycles after the memory reads the first final soft information element for the first layer; and after waiting (D-E) cycles, for a second layer associated with the constrained row of the H matrix and for each of the plurality of circulants: sequentially reading from the main memory the soft information elements of the circulant beginning at the initial soft information element associated with the matrix value of the constrained row associated with circulant until all of the soft information elements of the circulant are read; outputting the soft information elements to the P layer processors; and replacing the soft information elements stored in the main memory with the updated soft information elements output by the P layer processor.

In an example embodiment, the main memory comprises a plurality of memory elements, each memory element for storing a circulant of the codeword.

In an example embodiment, the layer processors remove extrinsic information from a previous iteration of the layer from the soft information element to generate a subtractor output.

In an example embodiment, the layer processors generate and store extrinsic information for removal from the soft information elements during processing of the layer in a subsequent iteration.

In an example embodiment, the layer processors add generated extrinsic information to the subtractor output to generate the updated soft information elements.

In an example embodiment, the layer processors utilizes a belief propagation method.

In an example embodiment, the LDPC decoder comprises a layered quasi-cyclic LDPC (QC-LDPC) decoder, each row is associated with one layer of a QC-LDPC code, and all rows in the one layer comprise constrained rows.

In an example embodiment, each circulant of the codeword has a size of Q bits, and each of the plurality of matrix values is associated with a Q×Q circulant matrix, and each one of the matrix values ($H_n$) of a constrained layer n, where n is a positive integer, satisfies: $H_n > (H_{n-1} - E_n * P + Q) \bmod Q$, wherein $H_{n-1}$ is the selected first matrix value associated with a first layer that immediately precedes the constrained layer and with the same column as the one of the matrix values $H_n$ in the constrained layer, and $E_n$ represents a pipeline stall reduction factor between layer n and layer n−1.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

FIG. 1 shows an example of an LDPC H matrix 100 defining an LDPC code for decoding a codeword comprising N input, or data, bits and M parity bits. The LDPC H matrix 100 has N+M columns, one for each of the input and parity bits of the codeword, and M rows, each row setting out one of M parity equations having even parity.

In a subclass of LDPC codes, known as quasi-cyclic LDPC (QC-LDPC) codes, a QC-LDPC H matrix includes matrix values that each represents a Q×Q circulant matrix. In a QC-LDPC code, a codeword comprises data and parity circulants, each circulant having Q bits. The value Q may be referred to as the Q-factor of the QC-LDPC code.

FIG. 2 shows an example of a QC-LDPC matrix 200 having a Q-factor of 8 for decoding a QC-LDPC codeword having five circulants of input, 5Q input bits in total, and five circulants of parity, 5Q parity bits in total. Each row of the QC-LDPC H matrix 200 represents Q parity check equations, which are set out in the Q×Q circulant matrices represented by the matrix values associated with the matrix elements of the row. In an embodiment comprising a layered decoder, a layer in the layered decoder can comprise one or several rows that are orthogonal to each other, such that each column is connected to at most one row in the H matrix. Each column of the QC-LDPC H matrix is associated with a circulant of the codeword, and each column of a circulant matrix is associated with one bit of the codeword circulant that associated with that circulant matrix.

Matrix values of the QC-LDPC matrix 200 that are −1 represent a circulant matrix that includes all zeros. A matrix value that is greater than or equal to zero represent circulant matrix given by an identity matrix shifted by a number of rows of the matrix value amount. Thus, a matrix value of 0 would represent an identity matrix. A matrix value of 1 represents an identity matrix shifted by one row. For example, the matrix value 202 in the first row and first column of QC-LDPC (i.e., $H_{1,1}$) is equal to 4 and represents the circulant matrix 300 shown in FIG. 3.

The circulant matrix 300 is an 8×8 identity matrix that has been rotated by a factor of 4. In the circulant matrix 300, a "1" is located in first row 302 at the fifth column 304, in the second row 306 at the sixth column 308, and so forth. The circulant matrix 300 is a "weight-1" matrix, meaning that meaning that a single "1" is present in each row and in each column. Having a QC-LDPC H matrix 200 in which matrix elements represent weight-1 circulant matrices based on rotated identity matrices significantly simplifies implementing the encoder and decoder compared to utilizing a random LDPC H matrix.

FIG. 4 illustrates an example of a layered QC-LDPC decoder 400 according to an embodiment of the present disclosure. Embodiments of the present disclosure are generally applicable to any LDPC decoder, including a flood decoder. In an embodiment, such as shown in FIG. 4 the LDPC decoder comprises a layered QC-LDPC decoder.

In an embodiment, each row is associated with one layer of a QC-LDPC code, and all rows in the one layer comprise constrained rows. In an embodiment, a constrained layer comprises partial row orthogonality with the previous row. In an example embodiment including multiple rows per layer, all rows in the layer have full column orthogonality, whereby none of the rows in the layer can be connected to the same column.

Any discussion herein of orthogonal rows can be extended, in another embodiment, to orthogonal layers. A layer can comprise a collection of rows that are intra-layer orthogonal, where intra-layer orthogonal means that each column of data is used exactly once per layer. In such an example embodiment, all rows in a given layer must have the same E factor.

The example layered QC-LDPC decoder 400 in FIG. 4 includes an input 402, an output 403, a main memory 404, a shifter array 408, and a layered processor array 410.

A codeword is received by the QC-LDPC decoder 400 at the input 402, which is connected to the main memory 404. The codeword comprises N circulants of data bits and M circulants of parity bits. The codeword is written to a main memory 404 as soft information elements. In the example QC-LDPC decoder 400 shown in FIG. 4, the main memory 404 includes a plurality of memory elements 406 such that the soft information elements each of codeword circulant are stored in an associated memory element 406. In an embodiment, each memory storage element is a two-port memory supporting one write and one read per clock cycle. In an embodiment, the two-port memory of each memory element is implemented as two-port register files.

In other embodiments, the main memory 404 may include a single memory element that stores the soft information elements of all of the codeword circulants.

In some embodiments, the QC-LDPC decoder 400 may read more than one soft information element from each memory element 406 per cycle of operation. The number of soft information elements read per cycle is known as the parallelism factor, P, of the decoder. In general P is an integer divisor of Q so that there are k=Q/P cycles of operation in every layer of processing. Higher values of P are selected to increase decoding throughput at the expense of addition area; in general the area and throughput of the decoder scale linearly with P.

Typically, when a QC-LDPC decoder 400 has P>1, the memory elements 406 will include k=Q/P memory addresses, each address associated with P soft information elements. In general, the P soft information elements read during a cycle, determined by the H matrix, will be located at more than one memory address. A shifter array 408 is utilized to perform a shifting process such that the P soft information elements of a particular cycle are input to a layered processor array 410 for processing. The shifter array 410 includes a plurality of shifters 411 such that one shifter 411 is associated with each memory element 406.

The output 412 of the shifter array 408 is P soft information elements from each memory element 406, which are aligned to form the inputs for layered processor array 410. The layered processor array 410 includes P layer processors 414 operating in parallel. Each layer processor 414 performs a check node operation on the soft information elements associated with one parity equation to determine updated soft information elements.

Figure 5:
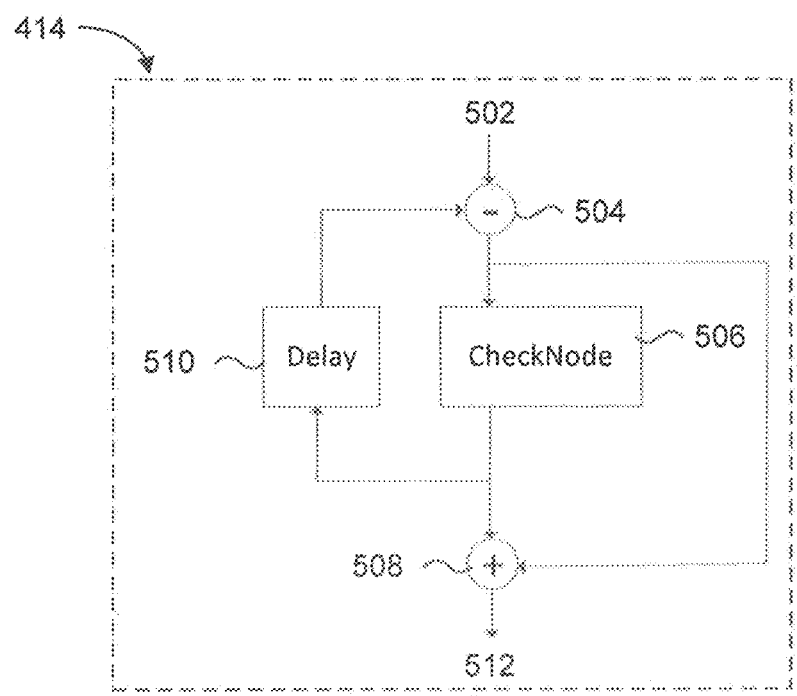
FIG. 5 is a block diagram illustrating a layer processor of the QC-LDPC decoder shown in FIG. 4.

Referring to FIG. 5, an example of a layer processor 414 is shown. The layer processor 414 includes an input 502, a subtractor 504, a check node processor 506, an adder 508, a delay element 510, and an output 512.

Input 502 from the shifter array 408 is received by the subtractor 504 which removes past extrinsic information for the current layer from the soft information elements to generate variable information for the respective layer in the QC-LDPC H matrix currently being operated on. The check node processor 506 performs an approximation of the belief propagation method, such as the min-sum method, or its alternatives, and outputs extrinsic information for the current layer. The adder 508 combines the extrinsic information output by the check node processor 506 with variable information for the layer and provides the combined extrinsic information and channel information as updated soft information elements and outputs the updated soft information elements via the output 508. The delay element 510 stores the extrinsic information from the check node processor 506 to facilitate subtracting the extrinsic information from the input 502 the next time the layer is processed during a subsequent iteration.

The P outputs at 512 from the P layer processors 414 operating in parallel form the output 416 of the layered processing array 410. The updated soft information elements output by the layered processing array 410 are received by the main memory 404 where corresponding original soft information elements stored in the memory elements 406 are replaced with the updated soft information elements received via the output 416. The updated soft information elements are written over the original soft information elements after a delay of D cycles from the time that the original soft information elements are read, D being the inherent delay associated with the QC-LDPC decoder 400.

After all of the layers of the QC-LDPC matrix are processed, the layers may be processed again in a subsequent iteration. The iterative decoding process proceeds based on the specified QC-LDPC H matrix until the decode process has completed either by converging to a solution or running out of processing time. After the iterative decoding process completes, the processed codeword may be output via output 403.

Figure 6:
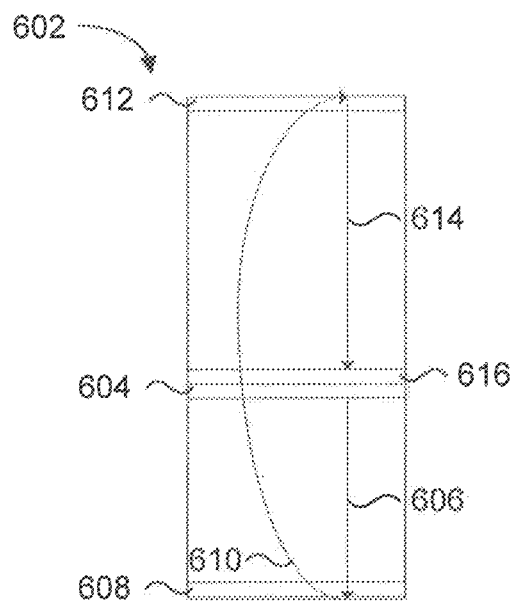
FIG. 6 is a block diagram illustrating a memory element during processing of soft memory elements in a QC-LDPC decoder shown in FIG. 4.

FIG. 6 illustrates an example of how soft information elements are read from a memory element 602 during processing of a layer of a QC-LDPC code. The memory element 602 may correspond to one of the memory elements 406 of the main memory 404. In the first cycle of the layer, an initial soft information element 604 is read. The initial soft information element 604 in the memory element 602 is determined by the matrix value corresponding the row associated with the layer and column associated with the memory element 602, as described above. In subsequent cycles, subsequent soft information elements are read sequentially, as denoted by arrow 606, until a last soft information element 608 is reached and, wrapping back to the first soft information element 612, denoted by the arrow 610, further soft information elements are sequentially read, as denoted by arrow 614, until a final soft information element 616 is read. The content of the other memory elements 406 of the main memory 404 are read similarly to memory element 602, each memory element 406 starting from an initial soft information element determined by a corresponding H-matrix value.

Because of the inherent delay of D cycles of the QC-LPDC decoder 400, during the cycle after the final soft information element 616 is read from the memory element 602, a number of soft information elements immediately preceding the initial soft information element 604 have been read but are still being processed and, therefore, are not yet updated soft information. Such soft information elements are referred to as being "in the pipe".

Figure 7:
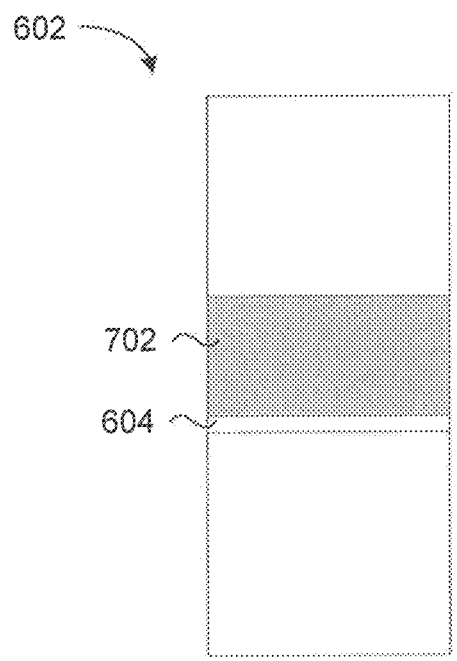
FIG. 7 is a block diagram illustrating the memory element of FIG. 6 after a processor layer is complete.

FIG. 7 shows an example of the memory element 602 during the cycle after the final soft information element 616 has been read. A region 702 represents the soft information elements that are "in the pipe". Considering the case where one check node is processed every cycle, i.e., parallelism factor P=1, each cycle of operation writes a single soft information element to each memory element 406 and each memory element 406 is fully updated after D cycles. The region 702 includes D soft information elements. In general, each cycle of operation writes P soft information elements to each memory element 406, and the number of soft information elements within the region 702 is the product D*P.

In prior art QC-LDPC decoders 400, a stall period of D clock cycles is waited before beginning the next layer by initiating the read sequence at a new initial soft information element as dictated by the next row in the QC-LDPC matrix. Because matrix values of prior art QC-LDPC matrices are effectively random, it is probable that at least one of the matrix values of a layer will be associated with an initial soft information element that is within a region 706 of soft information elements in the pipe from a previous layer. Therefore, prior art QC-LDPC decoders wait a stall period of D cycles between layers to ensure that the initial soft information element at which a read sequence is initiated will be a soft information element that has been updated during the previous layer for each circulant.

An ideal QC-LDPC decoder operating without stall periods between layers can process a layer in k=Q/P clock cycles. In the present disclosure, a method for generating an QC-LDPC H matrix for QC-LDPC decoders is provided that constrains the initial soft information elements of a layer such that they lie outside the region 702 of soft information elements "in the pipe" from the previous layer. Utilizing the generated QC-LDPC H matrix, a QC-LDPC decoder may operate without stalls, or with a reduced stall, between one or more layers, thus increasing the throughput rate of the QC-LDPC decoder compared with the prior art QC-LDPC decoders.

Figure 8:
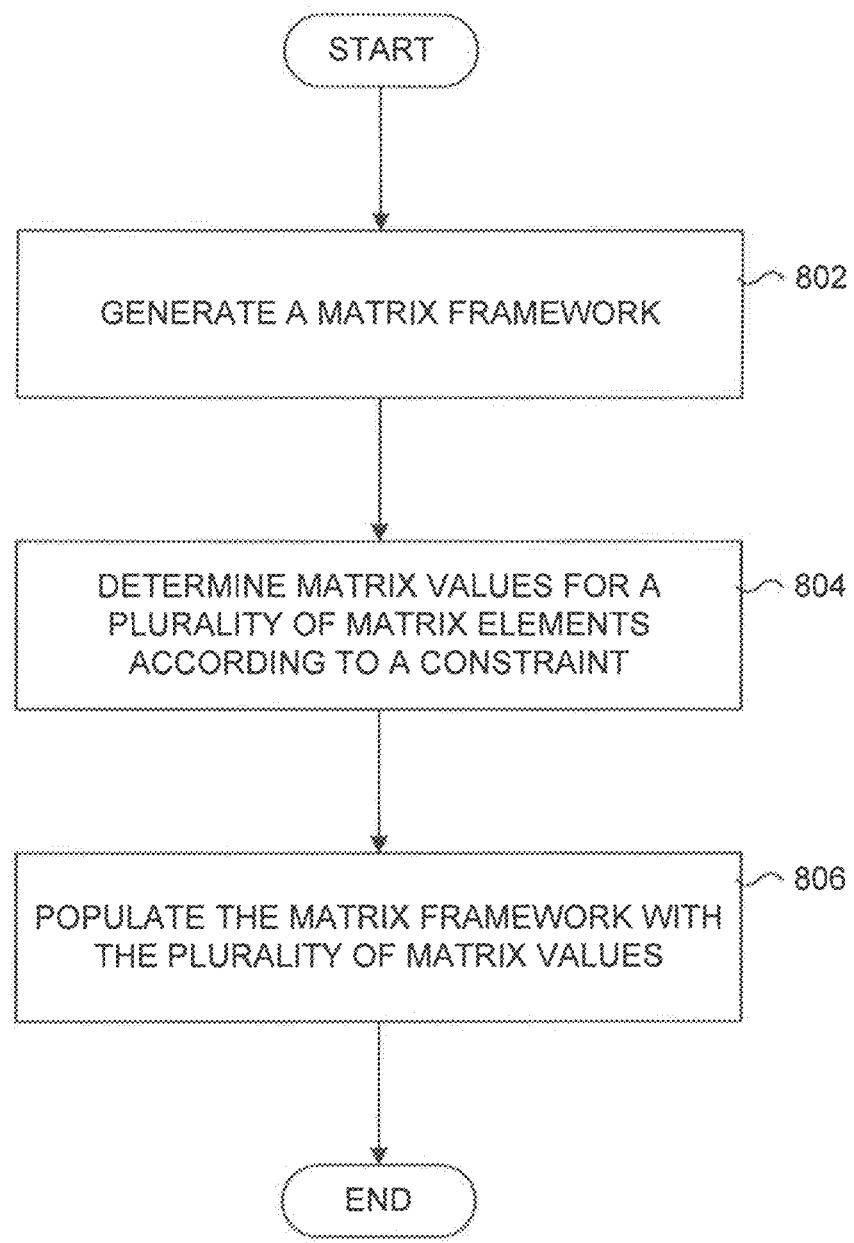
FIG. 8 is a flow chart illustrating a method of generating a QC-LDPC matrix according to an embodiment.

FIG. 8 illustrates a flow chart illustrating a method of generating a QC-LDPC H matrix for providing a set of parity equations for use in a QC-LDPC decoder to reduce stall periods between at least one pair of layers according to an embodiment of the present disclosure. At 802, a matrix framework is generated. Similar to the QC-LDPC matrix 200, the matrix framework has a plurality of rows and columns, each row associated with one layer of a QC-LDPC code, and each column associated with one of a plurality of circulants of a codeword.

A matrix value of each row and column position of the matrix framework is determined at 804. As described above, each matrix value determines an initial soft information element for a memory element associated with the column of the matrix value, the memory element storing the soft information elements of a particular circulant of the codeword.

In an embodiment, the matrix values for at least one row, referred to herein as a constrained row, are constrained such that each matrix value of the constrained row are associated with initial soft information elements that are not within a region of E*P soft information elements that are "within the pipe" at a time E cycles after the last soft information element is read for the layer that precedes the constrained row. E is an integer number less than or equal to D, the inherent delay of the QC-LDPC decoder. Constraining the matrix values of the constrained row in this way ensures that the initial soft information elements of the constrained row are not a soft information element within the pipe E cycles after the final soft information element of the previous layer is read. Thus, the layer of the constrained row may be processed after waiting a delay of E, rather than D.

In one embodiment, the matrix values ($H_n$) of the constrained row are determined by satisfying the below equation (1):

$$H_n > (H_{n-1} - E*P + Q) \bmod Q \qquad \text{(equation 1)}$$

Where $H_{n-1}$ is the matrix value associated with the same column as the matrix value $H_n$ and the row that immediately precedes the constrained row. Because QC-LDPC decoding is an iterative process, the first row of an H matrix is considered to immediately precede the last row because the layer associated with the first row is processed immediately after processing the layer associated with the last row.

In equation (1), Q is added and the modulo of Q is applied to ensure that the value of $H_n$ is in the range from 0 to Q−1. Consider, for example, a case in which E*P=64, Q=512, and $H_{n-1}$=0. The initial soft information element of the layer associated with $H_{n-1}$ is the first soft information element of that circulant because $H_{n-1}$=0. Thus, the 64 soft information elements that precede the first element, which correspond to soft information elements 448-511, are "in the pipe" E cycles after the last soft information element of the circulant associated with $H_{n-1}$ is read.

In an example embodiment, each circulant of the codeword has a size of Q bits, and each of a plurality of matrix values is associated with a Q×Q circulant matrix. In such an embodiment, each one of the matrix values ($H_n$) of a constrained layer n, where n is a positive integer, satisfies a modified version of equation 1:

$$H_n > (H_{n-1} - E_n*P + Q) \bmod Q,$$

where $H_{n-1}$ is the selected first matrix value associated with the first row that immediately precedes the constrained layer and with the same column as the one of the matrix values ($H_n$) in the constrained layer, and $E_n$ represents a pipeline stall reduction factor between layer n and layer n−1.

Referring back to FIG. 8, once the matrix values of the plurality of matrix elements are determined, the matrix framework is populated with the plurality of determined matrix values at 806.

By determining the matrix value of each of the matrix elements of a particular row in the manner described above, processing of the layer associated with that particular row may begin after waiting (D-E) cycles after the final soft information element of the previous layer is read. Therefore, the stall period between the layer and the previous layer is E cycles less than the inherent delay of the QC-LDPC decoder, D.

Therefore, a QC-LDPC decoder utilizing a QC-LDPC H matrix in which the matrix values of at least one row have been generated by the above described method may begin processing the layer associated with that row after a stall period of (D-E) cycles after reading the final soft information element of the previous layer, reducing the delay between layers by E cycles compared to prior art QC-LDPC decoders.

In some embodiments, E is equal to D such that a layer may begin immediately after reading the final soft information element of the previous layer, completely eliminating the stall period. Adjacent layers, or rows of the H matrix, for which no stall period is waited between processing the adjacent layers are referred to as fully orthogonal layers, or rows. Adjacent layers, or rows of the H matrix for which (D-E)>0 are referred to as partially orthogonal layers, or rows. A stall period of 0<(D-E)<D is waited between partially orthogonal layers, which is less than the full inherent delay D that is waited in prior art decoders. An orthogonality factor of a QC-LDPC code may be defined as E*P.

In some embodiments, any number of rows may be fully or partially orthogonal, while other rows may not be orthogonal, such that reduced stall periods may be realized between some, but not all, layers. For example, all of the rows of the H matrix may be constrained rows such that all of the rows are partially or fully orthogonal, and a stall period less than the inherent delay is realized for every layer.

In some embodiments, the value of E for one orthogonal layer may be different than the value of E for another orthogonal layer such that the stall time waited before processing each layer is different. However, each matrix value of a particular constrained row must be determined based on the same value of E.

Figure 9:
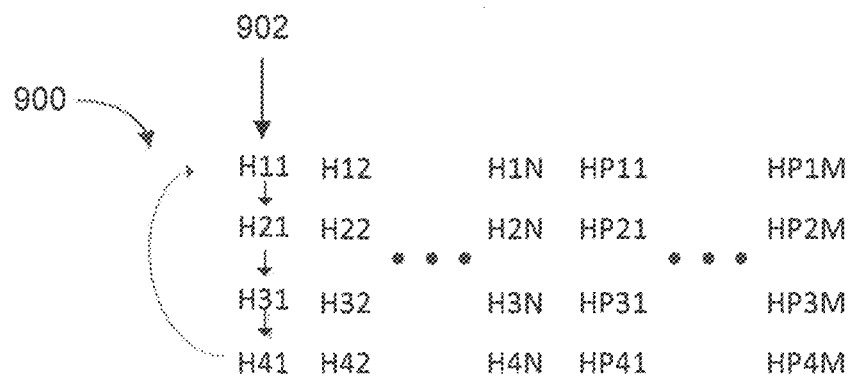
FIG. 9 is a block diagram illustrating a QC-LDPC matrix according to an embodiment.

FIG. 9 shows an example QC-LDPC H matrix in which all rows are partially or fully orthogonal. For example, in the first column 902, the matrix value associated with each row satisfies equation (1) relative to the matrix value of the matrix element of the immediately preceding row, which is indicated by the arrows shown in FIG. 9. Thus: the matrix value of matrix element $H_{21}$ satisfies equation (1) relative to the matrix value of matrix element $H_{11}$; the matrix value of matrix element $H_{31}$ satisfies equation (1) relative to the matrix value of matrix element $H_{21}$; matrix value of matrix element $H_{41}$ satisfies equation (1) relative to the matrix value of matrix element $H_{31}$; and the matrix value of matrix element $H_{11}$ satisfies equation (1) relative to the matrix value of matrix element $H_{41}$. A similar process is followed for the matrix values of the other columns of the QC-LDPC H matrix 900.

Figure 10:
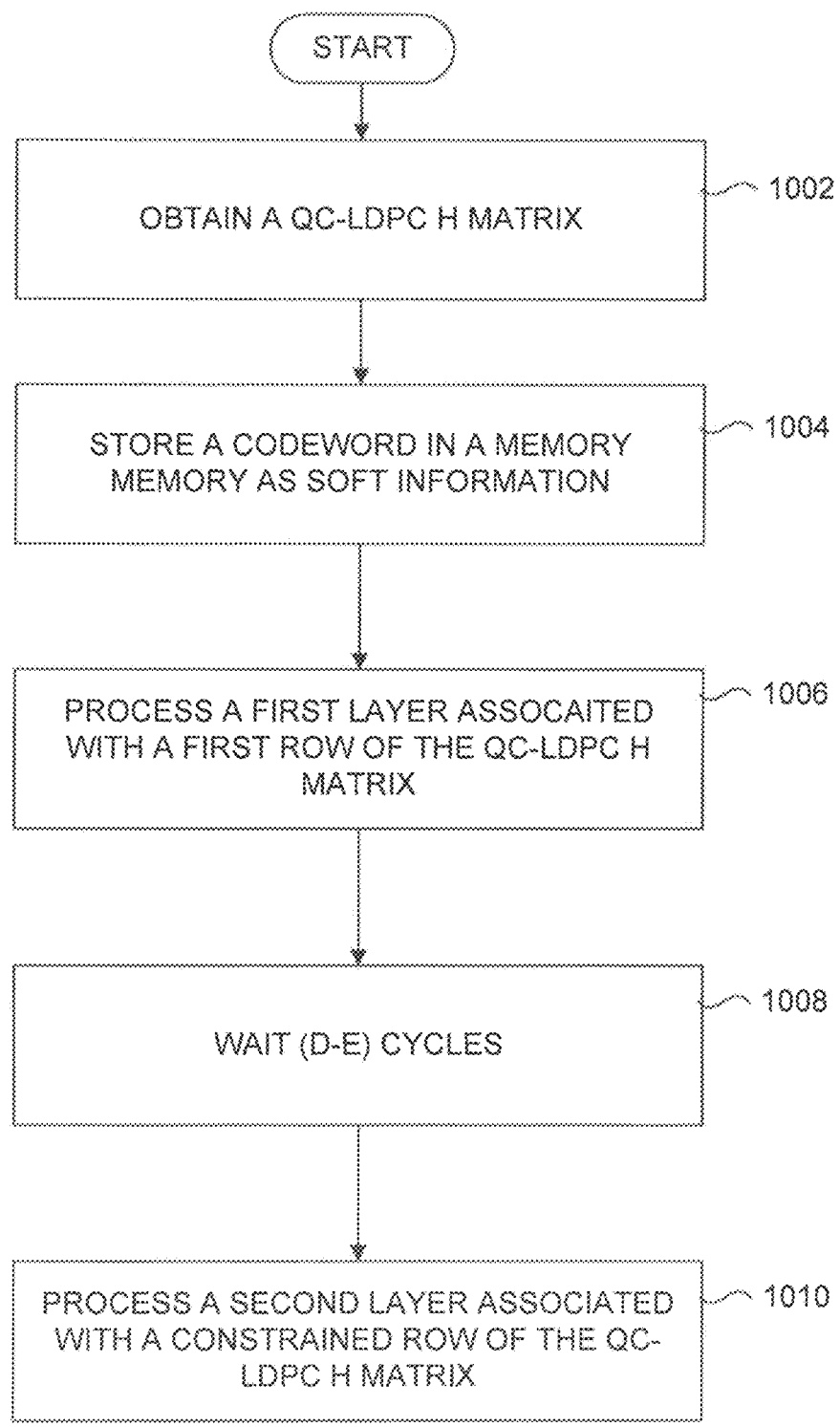
FIG. 10 is a flow chart illustrating a method of decoding a codework with a QC-LDPC decoder according to another embodiment.

Referring now to FIG. 10, a flow chart illustrating a method for decoding a codeword utilizing a QC-LDPC decoder is shown. At 1002, a parity-check matrix (QC-LDPC H matrix) is obtained. The obtained QC-LDPC H matrix includes at least one constrained row, as described above with reference to FIG. 8. In some embodiments, obtaining the QC-LDPC H matrix may include obtaining a stored QC-LDPC H matrix.

At 1004, a codeword is stored in a main memory as soft information elements in a plurality of circulants. In some embodiments, each circulant may be saved to an associated one of a plurality of memory elements.

At 1006, a first layer associated with the first row of the QC-LDPC H matrix is processed. Processing the QC-LDPC H matrix may comprise, for each of the plurality of circulants, sequentially reading the soft information element of the circulant beginning at the initial element associated with the matrix value of the first row associated with circulant until all soft information elements of the circulant are read; processing the soft information elements using a check-node processing element to generate updated soft information; and replacing the soft information elements stored in the main memory with the updated soft information.

At 1008, a period of (D-E) clock cycles after reading the final soft information element during the first layer is waited.

At 1010, a second layer associated with the constrained row of the QC-LDPC H matrix is processed. For each of the plurality of circulants, the soft information elements of the circulants are sequentially read beginning at the initial soft information element associated with the matrix value of the constrained row associated with the circulant, until all soft information elements of the circulant are read. The soft information elements are processed using a check-node processing element to generate updated soft information. In the case of a decoder having a parallelism factor of P, P soft information elements are processed in parallel during each cycle. The soft information elements stored in the main memory are replaced with the updated soft information.

Figure 11:
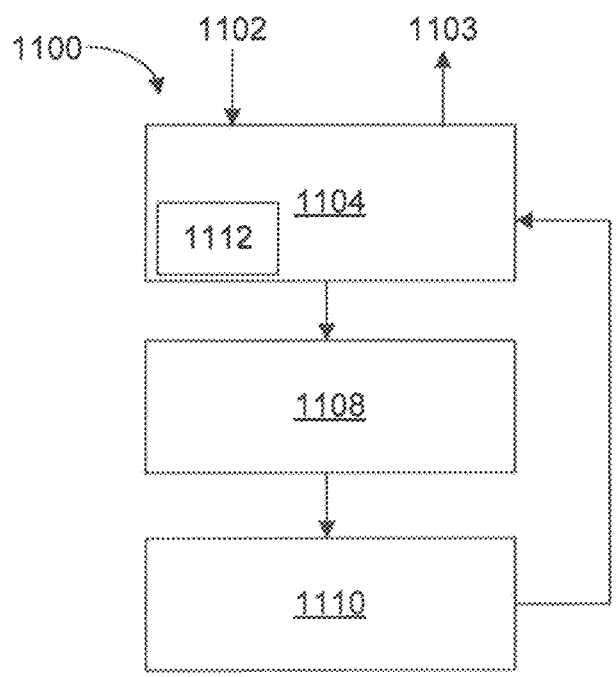
FIG. 11 is a block diagram illustrating a QC-LDPC decoder according to another embodiment.

Referring to FIG. 11, an example for a QC-LDPC decoder 1100 suitable for implementing the above described method of decoding a codeword is shown. The QC-LDPC decoder 1100 includes an input 1102, an output 1103, a main memory 1104, a shift array 1108, and a layered processor array 1110, and a memory controller 1112. In the case in which the main memory 1104 includes multiple memory elements, the controller 1112 may comprise multiple controllers such that each memory element has a corresponding controller. The input 1102, output 1103, the main memory 1104, the shifter array 1108, and the layered processor array 1110 may be substantially the same as the input 402, the output 403, the main memory 404, the shifter array 408, and the layered processor array 410 of the QC-LDPC decoder 400 described above and shown in FIG. 4 and are not further described herein to avoid repetition.

The controller 1112 controls the read and write operations of the main memory 1104.

During decoding of a first layer associated with a first row, the controller 1112 sequentially reads the soft information elements of each circulant of a codeword stored in the main memory 1104 beginning at an initial soft information element. As discussed above, the initial soft information elements are associated with the H-matrix value associated with the circulant. The soft information elements are sequentially read until all of the soft information elements are read.

When the layer following the first layer is a constrained layer having partial or full orthogonality, the controller 1112 waits a stall period of (D-E) cycles after all of the soft information elements are read in the first layer before beginning reading soft information elements of each circulant. The soft information elements of the circulant is sequentially read beginning at an initial soft information element associated with matrix value of the constrained row associated with the circulant. If the constrained layer is fully orthogonal, the stall period is zero cycles, and the controller 1112 begins reading the soft information elements for the second layer immediately after all of the soft information elements are read in the first layer.

In some embodiments, the controller 1112 determines the stall period to wait based on the orthogonality factor of the constrained row. In some embodiments, the orthogonality factors are different for different constrained rows, and the controller 1112 waits a different stall period before beginning reading soft information elements for different layers associated with different constrained rows.

Read data is passed to the shift array 1108, then to the layer processors of the layered processor array 1110, with updated soft information elements passed back to the main memory 1104, where the controller 1112 writes the updated soft information elements over the original soft information elements.

Figure 12:
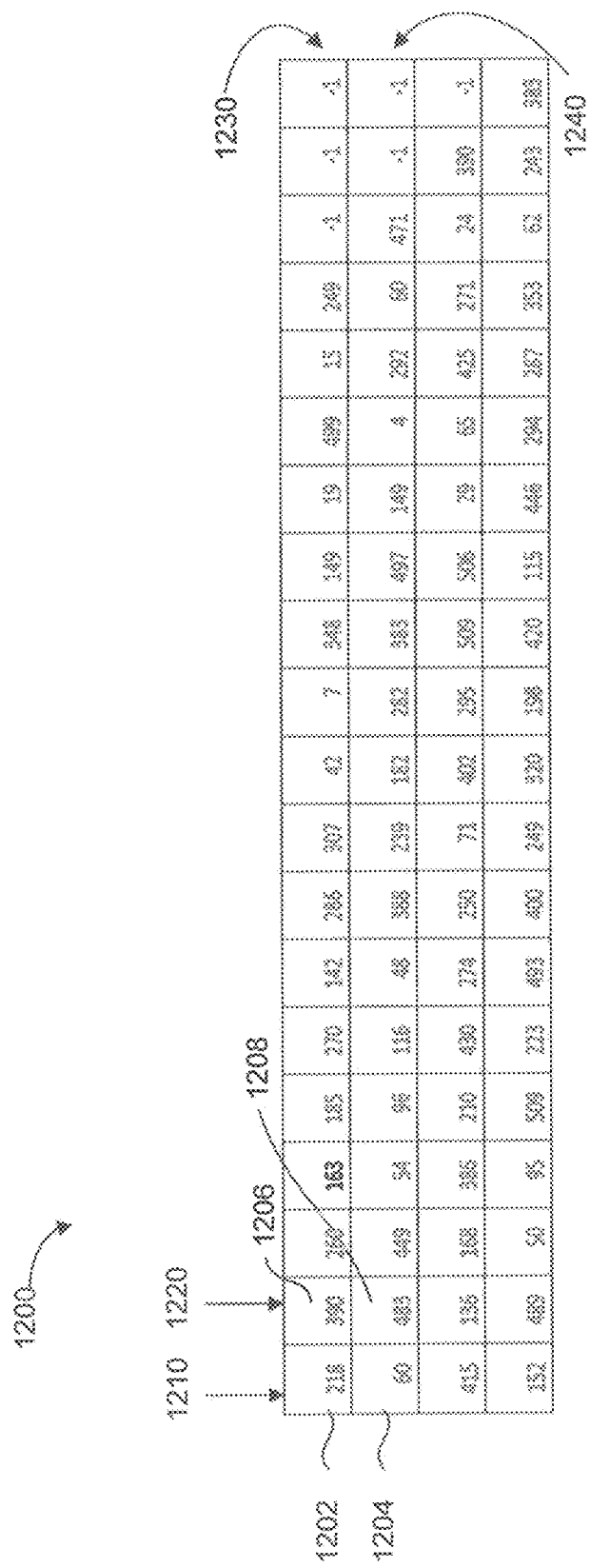
FIG. 12 is an example QC-LDPC H matrix according to another embodiment.

Referring now to FIG. 12, an example of a fully orthogonal QC-LDPC H matrix 1200 is shown. The number of columns in the QC-LDPC H matrix 1200 is 16, and the number of rows is 4. The QC-LDPC matrix has a Q factor of 512 such that each matrix value is representative of a 512×512 circulant matrix.

The QC-LDPC H matrix 1200 is generated such that all pairs of adjacent rows are fully orthogonal with an orthogonality factor of 64, meaning that a QC-LDPC decoder having D*P=64 could decode a codeword without waiting a stall period between all layers. For Q=512, some possible valid D and P values that would provide the desired orthogonality of 64 are: D=8, P=8; D=16, P=4; and D=64, P=1. QC-LDPC decoders that operate with an orthogonality factor less than 64 could also utilize the QC-LDPC H matrix 1200 to decode a codeword operated without waiting a stall period between layers.

A first row 1230 of the QC-LDPC H matrix is associated with a first layer and a second row 1240 is associated with a second layer. The first matrix value 1202 and the second matrix value 1204 of a first column 1210 are associated with the initial soft information elements of the first circulant in the first layer and second layer, respectively. The third matrix value 1206 and fourth matrix value 1208 of a second column 1220 are associated with the initial soft information elements of the second circulant in the first layer and the second layer, respectively.

Figure 13:
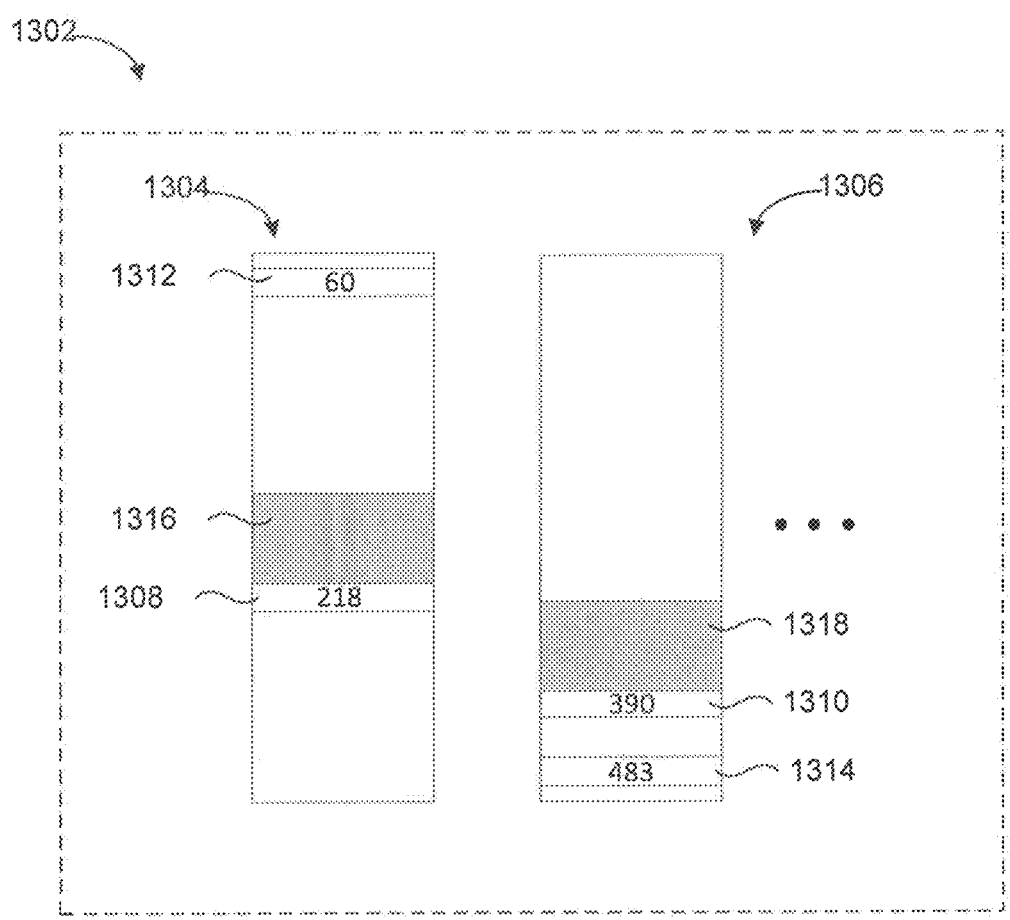
FIG. 13 is a block diagram illustrating memory elements during processing of soft memory elements using the QC-LDPC H matrix of FIG. 12.

Referring to FIG. 13, the operation of a first and second layer of a decoding process utilizing the QC-LDPC H matrix 1200 is illustrated in association with the first two memory elements of a main memory 1302. In the example described, D=64 and P=1 such that only 1 soft information element is read per cycle of operation. A codeword consisting of 16 circulants of data samples and 4 circulants of parity samples is stored in a main memory 1302, similar to main memory 404 described above. Each circulant of the codeword includes Q=512 soft information elements. The first 512 soft information elements (elements 0:511) are stored in a first memory element 1304 and the second 512 soft information elements (elements 512:1023) are stored in a second memory element 1306. Similarly, other circulants of the codeword are stored in other memory elements of the main memory 1302.

During processing of a first layer, soft information elements of the first memory element 1304 are read beginning at an initial soft information element 1308 determined from the first matrix value 1202, and soft information elements of the second memory element 1306 are read beginning at an initial soft information element 1310 determined from the second matrix value 1204. In the example QC-LDPC matrix 1200, the first matrix value 1202 has a value of 218, which represents a 512×512 identity matrix rotated by 218, which corresponds to the $218^{th}$ element of the first circulant of the codeword being the initial soft information element 1306. Similarly, the second matrix value 1204 is 390, which corresponds to the $390^{th}$ element of the second circulant being the initial soft information element 1308. During processing of the second layer, the initial soft information element 1312 of the second layer is the $60^{th}$ element, corresponding to the value of the third matrix value 1206, and the initial soft information element 1314 of the second circulant is the $483^{rd}$ element, corresponding to the fourth matrix element 1208.

Immediately after reading the final soft information elements, a region 1316 of soft information elements of the first memory element 1304, and a region 1318 of soft information elements of the second memory element 1306, are "in the pipe". In the present example, the regions 1316 and 1318 have a size of 64 soft information elements, given by the orthogonality factor D*P. FIG. 13 shows that the initial soft information element 1312 is outside of the region 1316 in the first memory element 1304, and the initial soft information element 1314 is outside of the region 1318 of the second element 1306. Similarly for the other 14 memory elements of the main memory 1302 that are not shown in FIG. 13, the initial soft information elements of the second layer lie outside of the region of soft information element "in the pipe". Thus, the second layer may begin processing immediately after the final soft information elements of the memory elements has been read, without having to wait a stall period.

Disclosed is a method of generating a QC-LDPC H matrix for use in a QC-LDPC decoder. Use of the disclosed QC-LDPC H matrix may increase throughput of the QC-LDPC decoder by reducing the stall period between layers. The increased throughput rate does not increase implementation area, and may be implemented through configuration of the QC-LDPC decoder control circuitry.

In some embodiments, the described QC-LDPC decoder may be implemented as an Application Specific Integrated Circuit (ASIC) or a Field-Programmable Gate Array (FPGA). In some embodiments, the QC-LDPC decoder may be include in systems such as, for example, a flash memory physical layer, a long-term storage media, satellite communications systems, or optical communication systems.

Power and Area efficient LDPC decoding is of critical importance in many modern communications systems. The disclosed QC-LDPC H matrix may be particularly useful for applications employing large codewords such as, for example, 8 k bits or more. For applications utilizing smaller codewords, partial orthogonality may be utilized for to increase throughput compared to prior art decoders.

The disclosed QC-LDPC facilitates increased throughput by constraining the matrix values during the generation or design phase of the QC-LDPC matrix. The constraints may be utilized for any project or new standard to facilitate increasing the throughput of any resulting decoder implementation.

Although the present disclosure describes H matrices having partially or fully orthogonal layers in the context of QC-LDPC decoding, in general, the concept of partially or fully orthogonal layers may be applied to any method or apparatus for LDPC layered decoding in order to reduce stall periods between layers.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A method of decoding a codeword utilizing a quasi-cyclic low density parity check (QC-LDPC) decoder, the method comprising:
    obtaining a parity-check matrix (H matrix) having:
        a matrix framework having a plurality of rows and columns, each row associated with one layer of a QC-LDPC code, and each column associated with one of a plurality of circulants of a codeword;
        a matrix value for each row and column position in the matrix framework, each matrix value being associated with an initial soft information element, wherein:
            for each one of the matrix values associated with a constrained row:
                the one of the matrix values is constrained to a set of constraint values associated with a set of initial soft information elements,
                the set of initial soft information elements excluding a number E*P of soft information elements that immediately precede a first initial soft information element, the first initial soft information element associated with a selected first matrix value associated with a first row that immediately precedes the constrained row and with the same column as the one of the matrix values in the constrained row,
                wherein E is an integer having a value less than or equal to the number of cycles of an inherent delay, D, of the QC-LDPC decoder and P is a parallelism factor of the QC-LDPC decoder;
    storing the codeword in a main memory as soft information elements in a plurality of circulants;
    processing a first layer associated with the first row of the H matrix, processing the first layer comprising, for each of the plurality of circulants:

sequentially reading the soft information elements of the circulant beginning at the initial soft information element associated with the matrix value of the first row associated with circulant until all of the soft information elements of the circulant are read;

sequentially processing the soft information elements using a check-node processing element to generate updated soft information elements; and sequentially replacing the soft information elements stored in the main memory with the updated soft information elements;

waiting (D-E) clock cycles after reading the first final soft information element;

processing a second layer associated with the constrained row of the H matrix, processing the second layer comprising, for each of the plurality of circulants:

sequentially reading the soft information elements of the circulant beginning at the initial soft information element associated with the matrix value of the constrained row associated with circulant until all of the soft information elements of the circulant are read;

processing the soft information elements using a check-node processing element to generate updated soft information elements; and replacing the soft information elements stored in the main memory with the updated soft information elements.

2. The method of claim 1, wherein each row of the obtained H matrix is a constrained row.

3. The method of claim 2, wherein a first value of E1 associated with a first constrained row is different than at least a second value of E2 associated with a second constrained row.

4. The method of claim 1, wherein each circulant of the codeword has a size of Q bits, and each of the plurality of matrix values is associated with a Q×Q circulant matrix.

5. The method of claim 1, wherein the QC-LDPC decoder comprises a layered QC-LDPC decoder wherein all rows in the one layer of the QC-LDPC code associated with each row comprise constrained rows.

6. The method of claim 5, wherein each circulant of the codeword has a size of Q bits, and each of the plurality of matrix values is associated with a Q×Q circulant matrix wherein each one of the matrix values of a constrained layer n, ($H_n$), where n is a positive integer, satisfies:

$$H_n > (H_{n-1} E_n * P + Q) \mod Q,$$

wherein $H_{n-1}$ is the selected first matrix value associated with a first layer that immediately precedes the constrained layer and with the same column as the one of the matrix values ($H_n$) in the constrained layer, and $E_n$ represents a pipeline stall reduction factor between layer n and layer n−1.

7. The method of claim 1, wherein E is equal to D.

8. The method of claim 1, wherein storing the raw data comprises storing each circulant of the codeword in a separate memory element.

9. A quasi-cyclic low density parity check (QC-LDPC) decoder having a parallelism factor of P and an inherent delay of D, the QC-LDPC decoder comprising:

P layer processors, each of the layer processors configured to process a soft information element to generate an updated soft information element, and output the updated soft information elements;

a main memory operably coupled to the P layer processors, the main memory for storing the codeword in a main memory as soft information elements in a plurality of circulants, the main memory including a controller configured to:

obtain a parity-check matrix (H matrix) having:

a matrix framework having a plurality of rows and columns, each row associated with one layer of a QC-LDPC code, and each column associated with one of a plurality of circulants of a codeword;

a matrix value for each row and column position in the matrix framework, each matrix value being associated with an initial soft information element, wherein:

for each one of the matrix values associated with a constrained row:

the one of the matrix values is constrained to a set of constraint values associated with a set of initial soft information elements, the set of initial soft information elements excluding a number E*P of soft information elements that immediately precede a first initial soft information element, the first initial soft information element associated with a selected first matrix value associated with a first row that immediately precedes the constrained row and with the same column as the one of the matrix values in the constrained row, wherein E is an integer having a value less than or equal to the number of cycles of the inherent delay, D;

for a first layer associated with the first row of the H matrix, and for each of the plurality of circulants:

sequentially reading from the main memory the soft information elements of the circulant beginning at the initial soft information element associated with the matrix value of the first row associated with circulant until all of the soft information elements of the circulant are read;

outputting the read soft information elements to the P layer processors;

replacing the soft information elements stored in the main memory with the updated soft information elements output by the P layer processors;

wait (D-E) clock cycles after the memory reads the first final soft information element for the first layer; and after waiting (D-E) cycles, for a second layer associated with the constrained row of the H matrix and for each of the plurality of circulants:

sequentially reading from the main memory the soft information elements of the circulant beginning at the initial soft information element associated with the matrix value of the constrained row associated with circulant until all of the soft information elements of the circulant are read;

outputting the soft information elements to the P layer processors; and replacing the soft information elements stored in the main memory with the updated soft information elements output by the P layer processor.

10. The QC-LDPC decoder of claim 9, wherein each row of the obtained H matrix is a constrained row.

11. The QC-LDPC decoder of claim 10, wherein a first value of E1 associated with a first constrained row is different than at least a second value of E2 associated with a second constrained row.

12. The QC-LDPC decoder of claim 11, wherein the decoder is configured to:

wait a first number of cycles between layers determined by the first value of E before processing a layer associated with the first constrained row; and wait a second number of cycles between layers determined by the second value of E before processing a layer associated with the second constrained row.

13. The QC-LDPC decoder of claim 9, wherein each circulant of the codeword has a size of Q bits, and each of the plurality of matrix values is associated with a Q×Q circulant matrix.

14. The QC-LDPC decoder of claim 13, wherein E is equal to D.

15. The QC-LDPC decoder of claim 9, wherein the QC-LDPC decoder comprises a layered QC-LDPC decoder wherein all rows in the one layer of the QC-LDPC code associated with each row comprise constrained rows.

16. The QC-LDPC decoder of claim 15, wherein each circulant of the codeword has a size of Q bits, and each of the plurality of matrix values is associated with a Q×Q circulant matrix, and wherein each one of the matrix values of a constrained layer n, ($H_n$), where n is a positive integer, satisfies:

$$H_n > (H_{n-1} - E_n * P + Q) \bmod Q,$$

wherein $H_{n-1}$ is the selected first matrix value associated with a first layer that immediately precedes the constrained layer and with the same column as the one of the matrix values ($H_n$) in the constrained layer, and $E_n$ represents a pipeline stall reduction factor between layer n and layer n−1.

17. The QC-LDPC decoder of claim 9, wherein the main memory comprises a plurality of memory elements, each memory element for storing a circulant of the codeword.

* * * * *